(12) United States Patent
Dono et al.

(10) Patent No.: US 10,896,738 B1
(45) Date of Patent: Jan. 19, 2021

(54) APPARATUSES AND METHODS FOR DIRECT ACCESS HYBRID TESTING

(71) Applicant: MICRON TECHNOLOGY, INC., Boise, ID (US)

(72) Inventors: Chiaki Dono, Kanagawa (JP); Chikara Kondo, Tokyo (JP); Roman A. Royer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/590,694

(22) Filed: Oct. 2, 2019

(51) Int. Cl.
   *G11C 29/00* (2006.01)
   *G11C 29/44* (2006.01)
   *G11C 29/48* (2006.01)
   *G11C 29/30* (2006.01)
   *G11C 29/36* (2006.01)
   *G11C 29/12* (2006.01)

(52) U.S. Cl.
   CPC .............. *G11C 29/44* (2013.01); *G11C 29/30* (2013.01); *G11C 29/36* (2013.01); *G11C 29/48* (2013.01); *G11C 2029/1208* (2013.01); *G11C 2029/3602* (2013.01); *G11C 2029/4402* (2013.01)

(58) Field of Classification Search
   CPC ... G11C 29/48; G11C 11/406; G11C 11/4085; G11C 8/12; G11C 11/401; G11C 29/14; G11C 29/50; G11C 29/50012; G11C 11/407; G11C 16/08; G11C 16/102; G11C 16/26; G11C 2029/0409
   USPC .. 365/201, 230.06, 194, 230.03, 233.1, 104, 365/185.04, 185.06, 185.11, 185.13, 365/185.21; 1/1
   See application file for complete search history.

(56) References Cited

U.S. PATENT DOCUMENTS

2019/0278511 A1* 9/2019 Lee .................. G11C 29/48

* cited by examiner

*Primary Examiner* — Thong Q Le
(74) *Attorney, Agent, or Firm* — Dorsey & Whitney LLP

(57) ABSTRACT

Embodiments of the disclosure are drawn to apparatuses, systems, and methods for direct access hybrid testing. A memory device, such as a high bandwidth memory (HBM) may include direct access terminals. During a testing procedure, test instructions may be provided to the memory through the direct access terminals. The test instructions include a data pointer which is associated with one of a plurality of test patterns pre-loaded in the memory and an address. The selected test pattern may be written to, and subsequently read from, the memory cells associated with the address. The read test pattern may be compared to the selected test pattern to generate result information. The test patterns may be loaded to the memory, and the result information may be read out from the memory, in an operational mode different than the operational mode in which the test instructions are provided.

22 Claims, 8 Drawing Sheets

APPARATUSES AND METHODS FOR DIRECT ACCESS HYBRID TESTING

BACKGROUND

This disclosure relates generally to semiconductor devices, and more specifically to semiconductor memory devices. Some memory devices may be mounted on a second device (e.g., a graphics card, a mother board, a computing system, etc.) as a system-in-package (SiP). The SiP may include a host device (e.g., a processor) and in a normal operation mode, access to the circuits of the memory may be performed through the host device. Memory devices may also include direct access terminals which are terminals which allow signals to be directly coupled to the memory device without the signals needing to pass through an interface between the memory device and the host device.

It may be desirable to test the memory device after it has been packaged onto the SiP device. For example, a test may involve writing a pattern of data to one or more memory cells, and then reading the written data back out. It may be desirable to bypass the other components of the SiP device in order to perform testing through the direct access terminals, however it may be difficult to provide long patterns of data through the direct access terminals.

DETAILED DESCRIPTION

Figure 1:
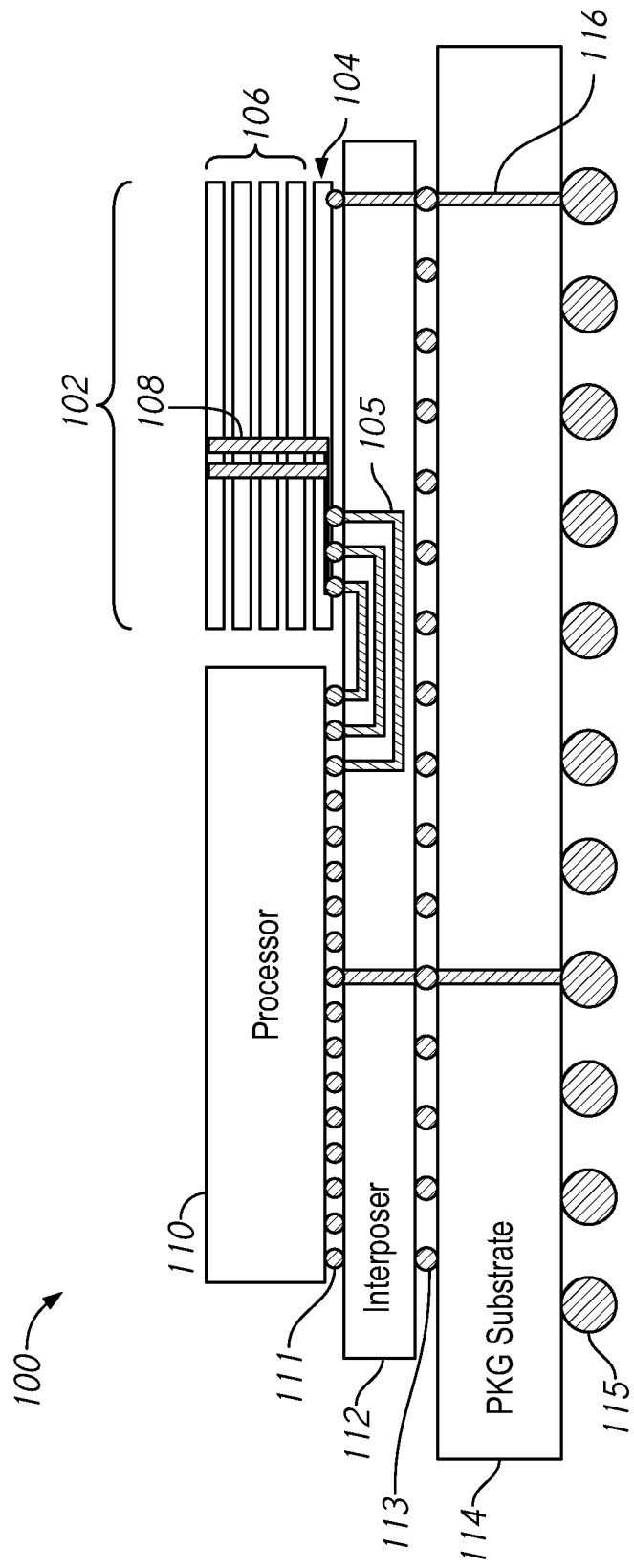
FIG. 1 is a cross-section of a system-in-package (SiP) device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a number of memory cells which may be used to store information. For example, each memory cell may store a single bit of information. Some memory devices may be packaged together with one or more other devices in a system-in-package (SiP) device. For example, the SiP device may include a memory device packaged on a computing device which includes one or more processors (e.g., GPUs, CPUs, etc.) which may act as a host device of the SiP. In a normal operation mode, information (e.g., data, instructions, clock signals and/or other signals) may be sent and received along channels between the host device and the memory device. The SiP device may also include direct access terminals, which allow information to be communicated to and from the memory device without needing to pass through the host device.

It may be desirable to perform one or more tests on the memory device after it has been packaged into the SiP device. In general, a test may involve loading a pattern of data into one or more memory cells of the memory device as part of a write operation, retrieving the stored information from the memory cells as part of a read operation, and comparing the written data to the read data. A test may be performed using a built-in self-test (BIST) circuit of the memory which may be loaded with test patterns of data as well as instructions for performing the test. However, in many cases, it may be useful to perform tests using extremely long test patterns with random characteristics, which may require more storage space than is practical in the BIST circuit. A test may also be performed by directly sending test patterns and instructions through the direct access terminals. However, there may be a relatively small number of available direct access terminals (e.g., compared to the number of connections between the host and memory devices), and it may be inefficient to provide a long test pattern through the direct access terminal during each test operation.

The present disclosure is directed to apparatuses, systems and methods for direct access hybrid testing. A number of test patterns may be pre-loaded into a memory device and stored in a look up table of the memory. As part of a test operation in a direct access (DA) hybrid mode, test instructions may be provided through the direct access terminals. The test instructions may include address information for one or more memory cells, as well as pointer information (e.g., an index of the look up table) to retrieve one or more test patterns from the look-up-table. The test pattern indicated by the pointer information may then be written to the memory cells indicated by the address information. The memory device may also include an error catch memory (ECM) circuit. The ECM circuit may compare information read from the memory cells to the test pattern in the look up table which was written to those memory cells and may generate result information based on that comparison. The result information may be read out of the memory through the direct access terminals.

FIG. 1 is a cross-section of a system-in-package (SiP) device according to an embodiment of the present disclosure. The SiP device 100 includes a memory device 102 and a processor 110, which are packaged together on a package substrate 114 along with an interposer 112.

The memory device 102 as shown in the example of FIG. 1 may be a high bandwidth memory (HBM) device, which includes an interface die (or logic die) 104 and one or more memory core dies 106 stacked on the interface die 104. The memory device 102 includes one or more through silicon vias (TSVs) 108, which are used to couple the interface die 104 and the core dies 106. The processor 110 may act as a host device of the SiP 100.

The processor 110 and the memory device 102 both are coupled to the interposer 112 by a number of micro-bumps 111. Channels 105 through the interposer 112 may couple some of the micro-bumps 111 which are coupled to the processor 110 to respective ones of the micro-bumps 111 which are coupled to the memory device 102 to form an interface between the memory device 102 and processor 110. Although only three channels 105 are shown in FIG. 1, greater or fewer numbers of channels 105 may be used. The interposer 112 may be coupled to the package substrate by one or more bumps such as C4 bumps 113. The package substrate 114 includes bumps 115, some of which are coupled to the processor 110 and some of which are coupled to the memory device 102. Direct access (DA) bumps 116 are coupled through the package substrate 114 and interposer 112 to the interface die 104.

The direct access bumps 116 (e.g., the portion of the bumps 115 which are coupled to the interface die 104) may be organized into a probe pad. An external device, such as a tester, may be coupled onto the probe pad in order to send and receive signals from the memory device 102, without those signals needing to pass to the processor 110. In particular, the tester may be used to pre-load one or more test patterns into a look up table of the interface die 104. The tester may then provide one or more test instructions along the direct access terminals 116. The interface die 104 may perform one or more tests on the core die 106 based on the test instructions and the pre-loaded test patterns and may generate result information. After performing the tests, the tester may read the result information out through the DA terminals 116.

Figure 2:
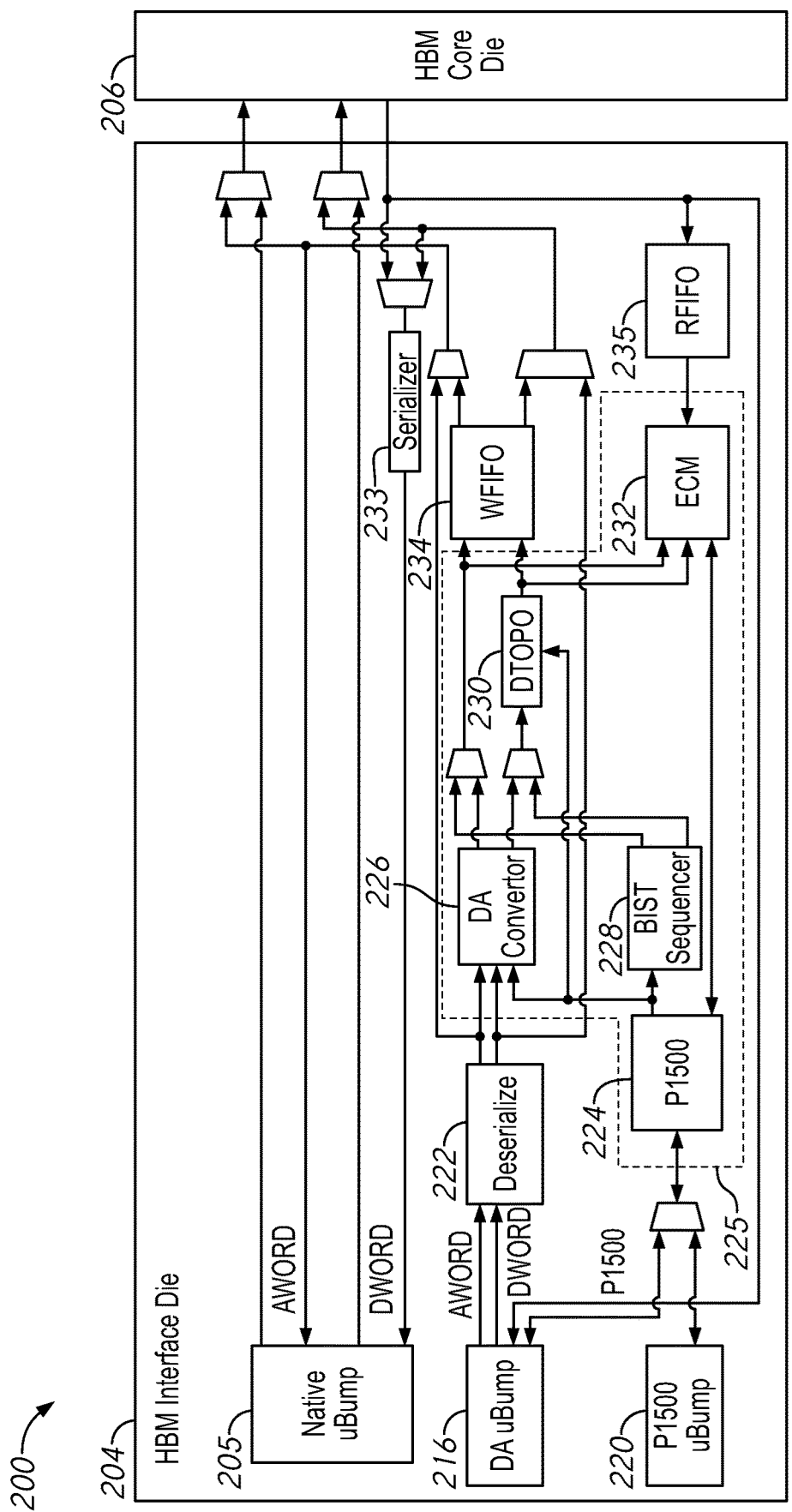
FIG. 2 is a block diagram of a memory device according to an embodiment of the present disclosure.
Figure 3:
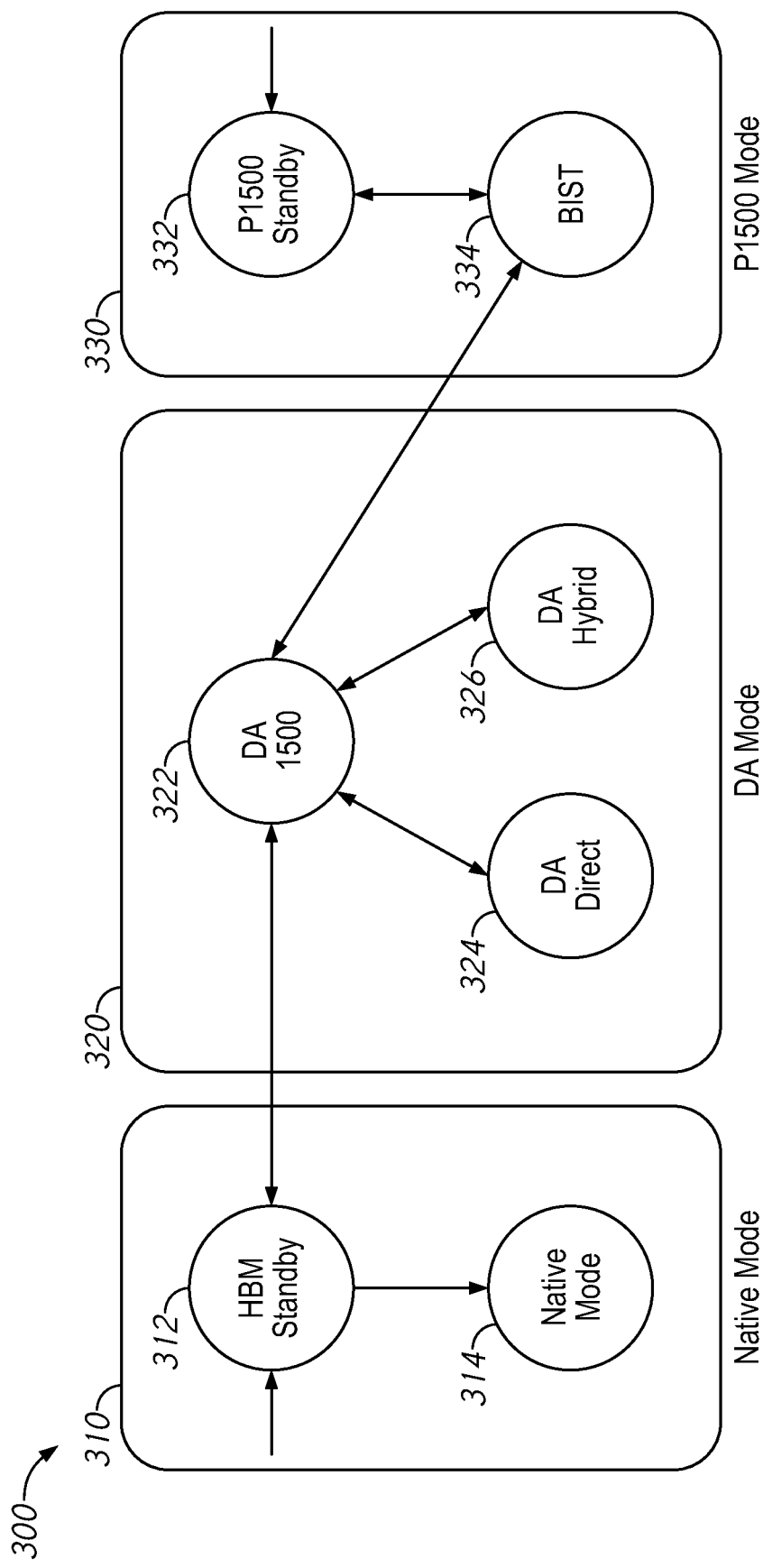
FIG. 3 is a state diagram of modes of operation of a memory device according to an embodiment of the present disclosure.

FIG. 2 is a block diagram of a memory device according to an embodiment of the present disclosure. FIG. 3 is a state diagram of modes of operation of a memory device according to an embodiment of the present disclosure. The memory device 200 may, in some embodiments, be included in the memory device 102 of FIG. 1. The state diagram 300 represents the operation of an example memory device such as the memory device 200. It should be understood that the memory device 200 may have more or fewer operational modes than are shown in FIG. 3, and that different paths between the states may be used in other embodiments (for example, in some embodiments a signal may transition the memory device 200 from HBM standby mode 312 to P1500 standby mode 332).

Similar to the memory device shown in FIG. 1, the memory device 200 may be a HBM device, with an interface die 204 and one or more core dies 206. For clarity, only a single core die 206 is shown in FIG. 2, however it should be understood that multiple core dies 206 may be coupled to the interface die 204 (e.g., there may be 3 or 7 core dies 206).

In order to highlight the operation of a test procedure, only certain components of the interface die 204 are shown which are involved in the testing process. It should be understood that other components of the interface die 204 which are not shown may be involved in various operations. For example, various components are shown coupled via multiplexers to represent that signals may be routed along different signaling paths. For purposes of clarity, the signals which control these multiplexers as well as the logic circuits which control such routing are not shown.

The memory device 200 includes three different interface terminals for accessing the core die(s) 206 and/or one or more circuits of the memory, native micro-bumps (uBumps) 205, direct access (DA) uBumps 216, and test interface uBumps 220. The test interface uBumps 220 may be part of a specific interface protocol, such as the IEEE 1500 interface (also referred to as a P1500 interface). In general the test interface uBumps 220 may be referred to as P1500 uBumps 220 (as well as related P1500 operational mode, P1500 circuits etc.), however it should be understood that other test interface protocols may be used in other example embodiments.

The state diagram 300 of FIG. 3 shows a native mode 310, a DA mode 320, and a P1500 mode 330. Each of these modes may contain one or more operational modes, each of which primarily use the specified interface terminals to communicate information to and from the memory device 200. For example, the native mode 310 includes an HBM standby mode 312 and a native mode 314, each of which primarily use the native uBumps 205 to communicate with the memory. The DA mode 320 includes a DA 1500 mode 322, a DA direct mode 324, and a DA hybrid mode 326, each of which primarily use the DA uBumps 216 to communicate with the memory device 200. The P1500 mode 330 includes a P1500 standby mode 332 and a built-in self-test (BIST) mode 334, each of which primarily use the P1500 uBumps 220.

After a reset signal is received, the memory device 200 may enter the HBM standby mode 312. While in the HBM standby mode 312, the memory device 200 may check to determine if the memory device 200 should transition to the DA1500 mode 322. While in the HBM standby mode 312, the memory device 200 may receive a command (e.g., along the native uBumps 205) which put the memory device 200 into a native operational mode 314. The native operational mode 314 may represent a normal operational mode of the memory device 200, where memory operations are performed according to signals sent and received from a host device (e.g., processor 110 of FIG. 1).

In the native operation mode 314 the logic die may send and receive information through the native uBumps 205. These native uBumps 205 may, in some embodiments, be included in the uBumps 111 of FIG. 1. The native uBumps 205 may be coupled to a processor (e.g., processor 110 of FIG. 1) via one or more channels (e.g., 105 of FIG. 1). The processor may access information (e.g., to perform read or write operations) in the core die(s) 206 by sending and receiving information through the native uBumps 205. The processor may also use the native uBumps 205 to perform one or more other operations of the memory device 200, such as initiating a refresh mode of the memory device 200.

In an example access operation as part of the native mode 314, signals may be received at the native uBumps 205 which requests an access operation such as a read operation on memory cells of one or more of the core dies 206. Command instructions which indicate a read operation along with an address which specifies the memory cells to be read may be received at the native uBumps 205 as part of a data packet called an 'AWORD'. The AWORD may contain address information, which may indicate which memory cells are to read. For example, each of the core dies 206 may include a memory array, which may include memory cells arranged at the intersection of rows (word lines) and columns (bit lines). The AWORD may contain address information such as a row address, and column address which specify the memory cells at the intersection of one or more rows and columns. The AWORD may also contain additional address information such as a bank address, the address of a particular core die 206 etc. The AWORD may also include command information, such as clock signals used for the timing of operations and commands which indicate if a read or write operation is being performed. Responsive to the address information during a read command, the core die 206 may respond by reading the data from the memory cell(s) specified by the address information and then providing the data as part of a DWORD, which may be provided to the native uBumps 205.

In another example operation of the native mode 314, information may be received at the native uBumps 205 which requests an access operation such as a write operation, on certain memory cells of one or more of the core dies 206. An AWORD may be received at the native uBumps 205 which specifies a write operation and includes address information for the memory cells to be written to, along with a DWORD which contains the data to be written. The AWORD and DWORD may be provided to the core die 206, which may write the information contained in the DWORD to the memory cells specified by the address information in the AWORD.

In some embodiments, the interface die 204 may include a serializer circuit 233 which is along the path that couples a DWORD out of one of the core dies 206 to the native uBumps 205. In such embodiments, there may be a much larger number of connections between the interface die 204 and core dies 206 than there are native uBumps 205. The serializer circuit 233 may receive information in parallel along a first number of data lines (e.g., from the core 206), and then provide that information in a serial fashion along a second number of data lines (e.g., to the native uBumps 205) which is smaller than the first number.

In some circumstances, it may be desirable to place the memory device 200 into a test mode in order to determine one or more characteristics of the memory device 200. The memory device 200 may include one or more test modes, some of which may utilize the test interface through the P1500 uBumps 220 and some of which may utilize the DA uBumps 216. The P1500 uBumps 220 may be used to send or receive signals through the host device using a particular test interface for sending and receiving signals. The memory device 200 may receive a test mode reset signal which places it into the P1500 standby mode 332. Similar to the HBM standby mode 312, in the P1500 standby mode 332, the memory device 200 may wait to receive one or more commands along the P1500 uBumps 220. When commands are received along the P1500 uBumps 220, the memory device 200 may transition from the P1500 standby mode 332 to the BIST mode 334.

During the BIST mode 334, the memory device 200 may send and receive signals using the P1500 uBumps 220 to operate a BIST sequencer 228. The P1500 uBumps 220 are coupled to a test interface circuit (e.g., a P1500 circuit) 224, which may interpret signals sent and received using the P1500 signal protocols. For example, the P1500 circuit 224 may translate signals received at the P1500 uBumps into signals usable by other circuits of the memory device 200 and vice versa. In a P1500 operational mode 330, the memory device 200 may receive signals through the P1500 uBumps 220 and provide those signals to the P1500 circuit 224. Similarly, signals from the memory device 200 may be provided to the P1500 circuit 224, which may then send those signals out of the memory device via the P1500 uBumps 220.

During the BIST operational mode 334, instructions may be received to operate the BIST sequencer 228 to perform a test on the memory. The BIST sequencer 228 may generate a test sequence (e.g., a string of logical bits) to write to memory cells of the core die 206. The BIST sequencer 228 may include a number of registers which may be used to store addresses of memory cells to test as well as a test sequence. Since space in the BIST sequencer 228 may be limited, the test sequence and/or addresses may be generated within the BIST sequencer 228 based on instructions. For example, the BIST sequencer 228 may perform a test on a certain address value, increment that address value by one, and then perform the test again. In some embodiments, to save space in the BIST sequencer 228, the BIST sequencer 228 may load the test sequences into a look-up-table, such as data topology (DTOPO) circuit 230. Each entry in the DTOPO circuit 230 may be associated with a pointer value (e.g., an index value) and in a manner similar to the addresses the BIST sequencer 228 may generate a sequence of pointer values.

During a write portion of a test in the BIST mode 334, the BIST sequencer 228 may provide address information (e.g., one or more row and column addresses) and a test sequence (e.g., data to be written to the memory cells specified by the address information) to an input buffer 234. In some embodiments, the BIST sequencer 228 may provide the address information to the input buffer 234, and may provide index information to the DTOPO circuit 230, which may provide the test sequence to the input buffer 234.

The input buffer circuit 234 may be a register, which may store values and then write them to the core die 206. The input buffer circuit 234 may operate as a first-in first-out (FIFO) circuit, and may be referred to as a write FIFO (WFIFO) circuit 234. Based on the address information provided from the WFIFO 234, the test sequence may be written to the memory cells specified by the address information.

During a read portion of a test in the BIST mode 334, the BIST sequencer 228 may provide address information to retrieve a test sequence previous stored in the core die 206. Information may be read out from the memory cells specified by the address information to an output buffer circuit 235. The output buffer circuit 235 may generally be similar to the input buffer 234, except that the output buffer 235 receives information from the core die 206 and then provides it on to other circuits of the interface die 204. The output buffer 235 may be a read FIFO (RFIFO) circuit 235.

An error catch memory (ECM) circuit 232 may be used to generate result information based on the read test sequence. The ECM circuit 232 may be coupled to the address information and test sequences provided to the input buffer 234, and more include one or more registers used to store the written test sequences as well as address information about which memory cells the test sequence was written to. When a read operation is performed, the ECM circuit 232 may compare the read test sequence from the output buffer 235 to the test sequence which was written to those memory cells as part of an earlier write operation, and may generate result information based on that comparison. The ECM circuit 232 may then provide the result information (e.g., which memory cells failed, as part of what test, etc.) to the P1500 circuit 224, which may then provide the result information out of the memory over the P1500 uBumps.

As well as the native mode 310 and the P1500 mode 330, the memory device 200 may also be entered into a DA mode 320. In some scenarios it may be desirable to bypass other components of a SiP package (e.g., such as the processor 110 of FIG. 1) to directly send and receive signals from the memory device 200. While the device is in one of the DA modes 320, signals may be sent and received along the DA uBumps 216, which may bypass other components of the SiP to and allow an external device (e.g., a tester circuit, a probe) to directly send and receive signals from the memory device 200.

While in HBM standby mode 312 the memory device 200 may be transitioned to one of the direct access modes 320, such as the DA1500 mode 322. This may involve activating a DA enable signal. For example, one of the DA uBumps 216 may be used as a DA enable pin, and when a DA enable signal, such as a logical high, is received at the DA enable pin, the memory may transition to the DA1500 mode 322. If the DA enable signal is not received (e.g., the DA enable pin is at a low logical level), the memory device may remain in the HBM standby mode 312. The memory device 200 may also be transitioned from BIST mode 334 to the DA1500 mode 322. This may involve the DA enable signal/pin, and/or may involve a signal sent via the P1500 interface.

The interface die 204 includes a number of direct access (DA) uBumps 216 (e.g., the DA bumps 116 of FIG. 1) which bypass other components of a SiP to allow direct coupling to and from the memory device. These DA uBumps 216 may, in some embodiments, be organized into a probe pad, where an external device (e.g., probes, a tester) may be coupled to DA uBumps 216 in order to access the interface die 204 (and through it the core die 206).

In a DA1500 mode 322, the DA uBumps 216 may be used to send and receive signals using the P1500 interface protocol. These signals may conform to the interface standards of the P1500 uBumps 220, except that the signals are sent and received through the DA uBumps 216 rather than the P1500 uBumps 220. As described in more detail herein, the DA1500 mode 322 may be used to load information to/from test circuits such as the DTOPO circuit 230 and/or the ECM circuit 232. Such information may be communicated between the DA uBumps 216 and the P1500 circuit 224 and then communicated to/from the other circuits as previously described in regards to the BIST mode 334.

For example, while the memory is in the DA1500 mode 322, test sequences may be loaded into the DTOPO circuit 230 through the DA uBumps 216. Each test sequence may represent a string of logical bits which may be provided (serially or in parallel) to the core die. The test sequence may have a number of bits to match the amount of data in one or more DWORDs. In an example operation, when the DTOPO circuit is loaded, the memory 200 may be placed into the DA1500 mode 322, and a tester may provide a string of bits to the DA uBumps 216, which may be routed to the P1500 circuit 224. The P1500 circuit in turn may then provide the string of bits to the DTOPO circuit 230, where the bits may be stored.

From the DA1500 mode 322, the memory device 200 may be placed into other DA modes 320. For example, the memory device 200 may be placed into a DA direct mode 324. In the DA direct mode 324, the memory device 200 may be operated in a manner analogous to the native mode 314, except the information is provided along the DA uBumps 216 instead of the native uBumps 205.

For example, in the DA direct mode 324, the DA uBumps 216 may receive (and/or provide) AWORDs and DWORDs in a manner similar to the native mode 314. In some embodiments, there may be less DA uBumps 216 than there are native uBumps 205. In order to mimic the operation of signals along the native uBumps 205, a deserializer circuit 222 may be used. The deserializer circuit 222 may receive the AWORD and DWORD from the DA uBumps 216 and then split the received serial data into a number of parallel channels. In some embodiments, the deserializer circuit 222 may split the AWORD and DWORD into a number of parallel channels to mimic the number of channels that the AWORD and DWORD are received along by the native uBumps 205.

In the DA direct mode 324, AWORDs and DWORDs may be received at the DA uBumps 216, provided to the deserializer circuit 222, and then provided to the core die(s) 206. Similarly, in the DA direct mode 324, AWORDs and DWORDs may be provided from the core die 206 to the DA uBumps. In this manner, while in the DA direct mode 324, the memory device 200 may be operated through the DA uBumps in a manner analogous to the way the memory 200 would be operated through the native uBumps 205 in the native mode 314.

Figure 8:
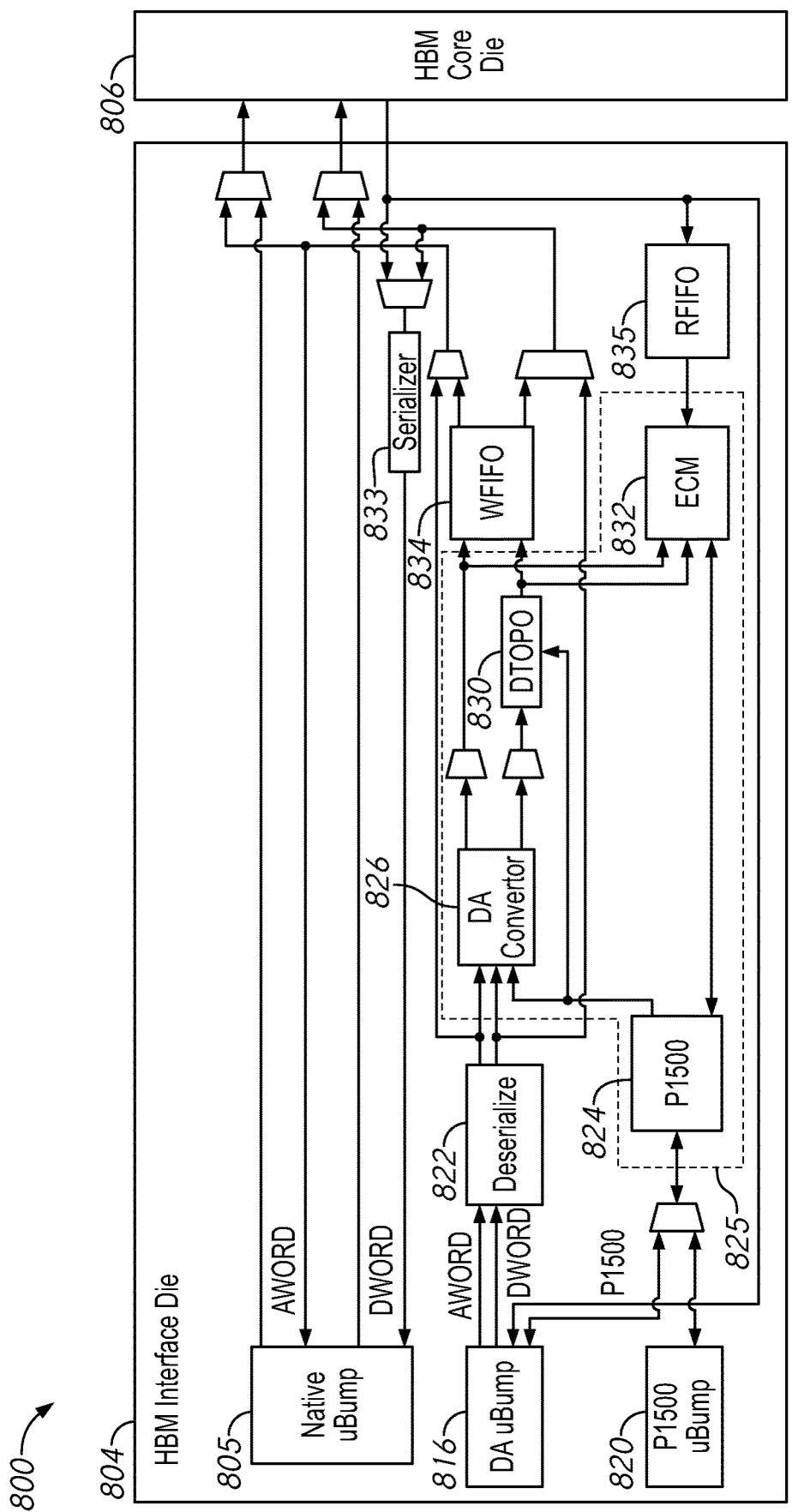
FIG. 8 is a block diagram of a memory device according to an embodiment of the present disclosure.

The memory device 200 may perform a test on one or more memory cells in one or more of the core dies 206 using a DA hybrid mode 326. In the DA hybrid mode, the memory may receive command instructions through the DA uBumps 216 which direct a test operation. Command such as AWORDs and DWORDs may be received through the DA uBumps 216, but instead of providing the test sequence as part of the DWORD, the DWORD may include pointer information used to retrieve a pre-loaded test pattern from the DTOPO circuit 230. In the DA hybrid mode 326, a DA hybrid circuit 225 may be used to manage the testing procedure. As shown in FIG. 2, the DA hybrid circuit 225 may include a number of components, such as the P1500 circuit 224, the DA converter circuit 226, the BIST sequencer 228, DTOPO circuit 230, and/or ECM circuit 232. Some of these components may be optional and may be omitted. For example, FIG. 8 shows an embodiment where the BIST sequencer 228 is omitted. Some components of the DA hybrid circuit 225 may be used primarily (or exclusively) in the DA hybrid mode 326 (e.g., the DA converter circuit 226) while other components of the DA hybrid circuit 225 may be shared between multiple operational modes (e.g., the P1500 circuit is used in the DA hybrid mode 326 as well as the DA1500 mode 322, and the P1500 modes 330).

Figure 4:
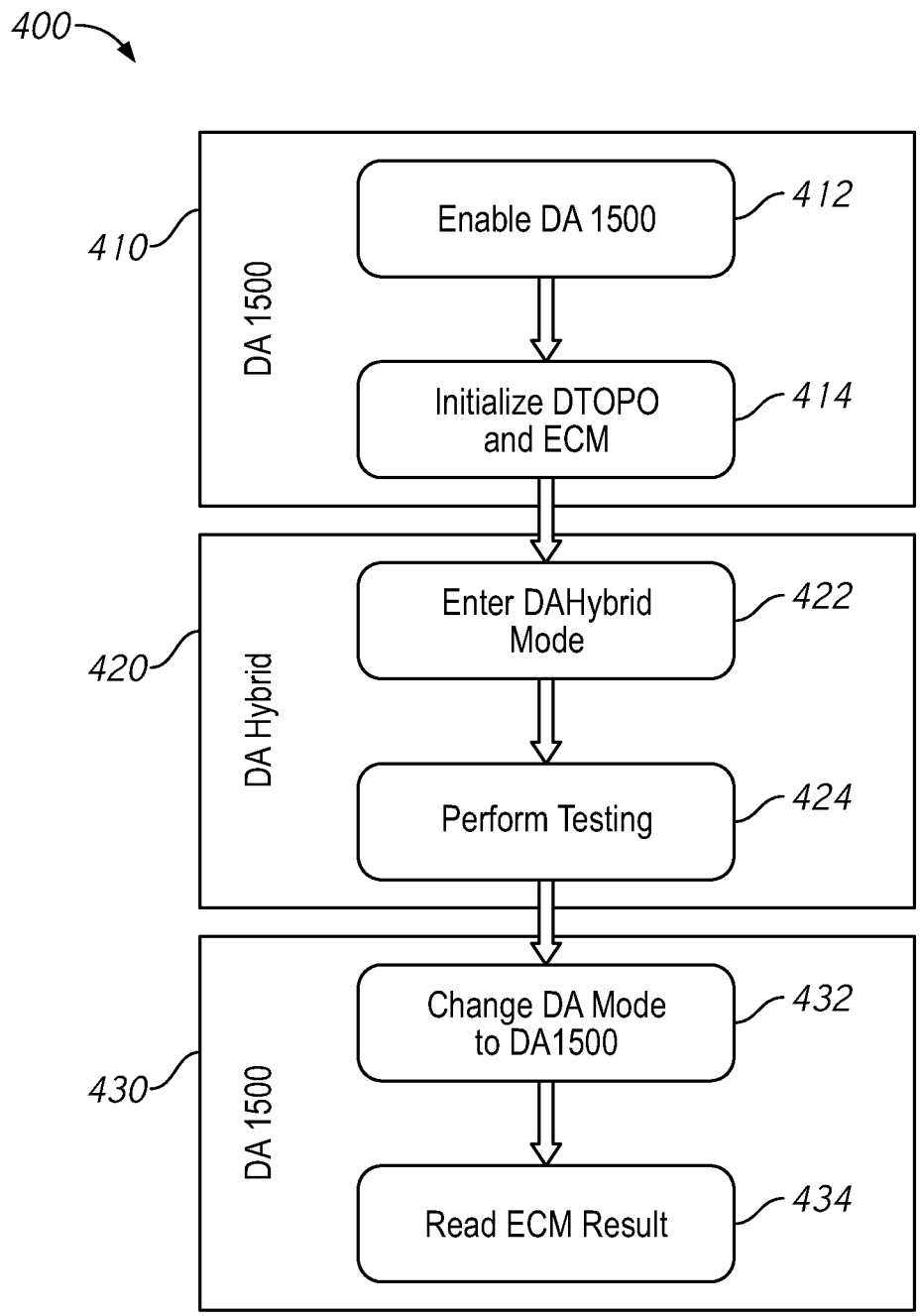
FIG. 4 is a flow chart of a method of performing a test operation according to an embodiment of the present disclosure.

FIG. 4 is a flow chart of a method of performing a test operation according to an embodiment of the present disclosure. The method 400 may illustrate a test mode which uses the DA hybrid mode (e.g., DA hybrid mode 326 of FIG. 3). Reference may be made the memory device 200 of FIG. 2 and the state diagram 300 of FIG. 3 to illustrate how the method 400 may operate.

The method 400 uses boxes 410 and 430 to represent steps which are performed when the memory device 200 is in a DA1500 mode 322, and box 420 to represent steps which are performed while the memory device 200 is in a DA hybrid mode 326. In general, the method 400 allows a test to be performed by sending test instructions through the DA uBumps 216, while the actual test sequence to be performed on the memory cells is pre-loaded on the memory device 200 (e.g., in the DTOPO circuit 230). Each test instruction may include address information which specifies one or more memory cells to be tested and pointer information which specifies one of the test patterns to be used to test the memory cells. In some embodiments, by providing a sequence of such test instructions, relatively long test patterns may be constructed by mixing and matching the pre-loaded test patterns over the course of different tests.

The method 400 may generally begin with box 412, which describes enabling a DA1500 mode of the memory. As previously described, the DA1500 mode 322 may be entered from the HBM standby mode 312 or from the BIST mode 334. The DA1500 mode 322 may be activated by providing a DA enable signal. For example the DA enable signal may be provided along a designated one of the DA uBumps 216.

Box 412 may generally be followed by box 414, which describes initializing the DTOPO circuit and the ECM circuit. While in the DA1500 mode 322, information may be provided through the DA uBumps 216 to the P1500 circuit 224. Based on the information provided, the P1500 circuit 224 may then route (all or a portion of) the information to the DTOPO circuit 230 and/or ECM circuit 232.

The DTOPO circuit 230 may be initialized by loading the DTOPO circuit 230 with a number of different data patterns (which are later used to build a test sequence). The data patterns may be strings of bits which can be written to memory cells. The DTOPO circuit 230 may act as a look-up table, with a number of entries each associated with an index value. For example, a DTOPO circuit 230 may include 8 different entries, and may use a 3 bit index code (e.g., with 8 total values). Greater or fewer numbers of entries and other systems of indexing may be used in other examples.

Each entry of the DTOPO circuit 230 may be used to store a different one of the data patterns loaded in through the DA uBumps 216 while the memory is in the DA1500 mode 322. In some embodiments, each data entry may include a number of bytes of data. In some embodiments, each entry may also include error correction information (e.g., error correction codes) associated with those bytes. The data entries may also be structured based on the way in which data is provided to the core die 206. For example, if the core die 206 is capable of accepting a number of data bits received in parallel in a given clock cycle (e.g., based on the number of data terminals of the core die 206), each data entry may include a number of bits to be provided in parallel to each data terminal. In some embodiments, each entry may include a first set of bits to provide at the data terminals during a first interval, a second set of bits to provide during a second clock interval, etc. Table 1 shows an example of the sequence of bits which may be loaded as one of the entries of a DTOPO circuit 230. The example of Table 1 shows a certain ordering of the bits stored in the DTOPO entry, however it should be understood that other orderings of the bits may be used in other example embodiments.

TABLE 1

Example Test Pattern/DTOPO Entry

| Bits | Description |
| --- | --- |
| Register group P | UI 3 Byte 3 Data |
| Register group O | UI 2 Byte 3 Data |
| Register group N | UI 1 Byte 3 Data |
| Register group M | UI 0 Byte 3 Data |
| Register group L | UI 3 Byte 2 Data |
| Register group K | UI 2 Byte 2 Data |
| Register group J | UI 1 Byte 2 Data |
| Register group I | UI 0 Byte 2 Data |
| Register group H | UI 3 Byte 1 Data |
| Register group G | UI 2 Byte 1 Data |
| Register group F | UI 1 Byte 1 Data |
| Register group E | UI 0 Byte 1 Data |
| Register group D | UI 3 Byte 0 Data |
| Register group C | UI 2 Byte 0 Data |
| Register group B | UI 1 Byte 0 Data |
| Register group A | UI 0 Byte 0 Data |

The different bytes are shown grouped together in register groups A-P. Each register group may represent a portion of the bits of in a given entry of the DTOPO circuit. For example, if each register group stores a byte of data, then each register group may store 8 bits of information. In some embodiments, each register group may store more bits in order to accommodate additional information associated with the data, such as error correction information. The example DTOPO entry of Table 1 includes four bytes provided at each of four different unit intervals (e.g., four 'bursts' of four bytes each). A unit interval may represent a clock waveform (or portion thereof) used to control timing in a memory. For example, the UI may represent a half clock cycle (e.g., a rising edge or a falling edge). In other words, when called from the DTOPO circuit 230, each data entry may be used to provide a first set of four bytes during a first unit interval, then a second set of four bytes during a second unit interval, a third set of four bytes during a third unit interval, and a fourth set of four bytes during a fourth unit interval. For example, during a first unit interval, the bytes from register groups A, E, I and M may be provided together. Then during a second unit interval, the bytes from register groups B, F, J, and N may be provided, etc.

In some embodiments, there may be multiple DTOPO circuits 230 in a memory device 200. For example, there may be a DTOPO circuit 230 for each channel of the memory, and for each DWORD which may be provided to the memory along those channels. This may act to provide a stream of data to the cores similar to the stream of DWORDS which are received in a native operational mode 314). For example, if there are 8 channels, each of which may carry 4 DWORDs, then there may be a total of 32 different DTOPO circuits 230, each of which may include multiple entries (e.g., 8 entries per DOTOP in 32 DTOPOs for 128 total entries).

Block 414 may generally be followed by block 422, which describes entering a DA Hybrid mode. When in a DA hybrid mode 326, information may be received at the DA uBumps 216 and provided to a DA converter circuit 226. For example, the information received in the DA hybrid mode 326 may include test instructions such as address information, and one or more data pointers which may be used to select a data pattern previously stored in the DTOPO circuit 230. The DA converter circuit 226 may route the information so that a test procedure is performed on the core die 206.

Block 422 may generally be followed by block 424, which describes performing testing on the memory. As previously discussed, the test may generally be performed by writing test data to memory cells of the core die 206, reading the data stored in those memory cells, and comparing the written test data to the read test data to determine if there are any differences.

During block 424, one or more write operations may be performed on the core die 206 by providing test instructions through the DA uBumps 216. In an example write operation, the DA converter circuit 226 may receive test instructions which include address information and a data pointer. The address information may be split and may be provided to the input buffer 234 as an AWORD. The data pointer may be provided to the DTOPO circuit 230, which provides the data pattern stored in the entry associated with the value of the data pointer to the input buffer 234 as a DWORD. Accordingly, the data pattern retrieved from the DTOPO circuit 230 may be written to the memory cells specified by the address information. In this manner, test instructions may be provided across the DA uBumps 216 without the need to also provide test data patterns at the DA uBumps 216, since the test data patterns are pre-loaded in the DTOPO circuit 230. An example of a test instruction is provided in Table 2.

TABLE 2

Example Test Instruction

AWORD

| DA Pin | I/O | Functionality |
| --- | --- | --- |
| DA[28] | I | DA En |
| DA[m + 8:m] | I | C[8:0] |
| DA[n + 6:n] | I | R[6:0] |
| DA[i] | I | CK_t |
| DA[j] | I | CK_c |
| DA[k] | I | CKE |

DWORD

| DA Pin | I/O | Functionality |
| --- | --- | --- |
| DA[p + x, p] | I | Data Pointer |
| DA[q] | I | Data Inv |
| DA[r + y, r] | I | Data mask |

The first column of Table 2 describes the pin(s) that a given signal is received at. Each pin may be an individual one of the DA uBumps 216. Different pin assignments may be used in various embodiments, so in the example of Table 2, pin assignments have been abstracted by using letters to represent the group of pins associated with a given signal. Letters such as m, n, i, j, k, p, x, q, r, and y are each used to represent an integer number. For example, DA[m+8:m] represents pins from pin number m to pin number 8+m. The exact value of a given letter may change in different embodiments.

In the embodiment represent by Table 2, there may be 60 different DA uBumps 216, however, in some embodiments some of those 60 DA uBumps 216 may be reserved and unavailable for use in a DA hybrid mode 326. For example, in some embodiments, 38 DA uBumps 216 may be usable in a DA hybrid mode 326. In some embodiments the DA converter 226 may transition between different modes based on how many DA uBumps 216 are available. For example, there may be a 38 DA mode (e.g., where only 38 of the 60 DA uBumps 216 are available) and a 60 DA mode. The example of Table 2 may represent a 38 DA mode. More (or fewer) pins, and different assignments of the pins to different functions may be used in other embodiments.

In the example of Table 2, one pin is reserved for use as the DA enable signal DA En. This may be used to indicate if the memory should transition from the native mode 310 or P1500 mode 330 to the DA mode 320. As shown in the example of Table 2, this may be pin number 28, however different pins may be used for the DA enable signal in other embodiments. Nine pins are used for a column address C[0] to C[8] while seven pins are used for a row address R[0] to R[6]. Two pins may be used for clock signals CK_t and CK_c respectively, while another pin is used for a clock enable signal CKE. The column and row address C and R along with the clock signals may be provided to the input buffer 234.

The test instruction may also include data pointer information bits (e.g., Dptr). In an example embodiment, since each DTOPO includes eight entries, the pointer information may be three bits long. Other numbers of bits of the data pointer may be used in other embodiments. Also included is a data inverse bit (e.g., Dinv). When the data inverse bit is active (e.g., at a high logical level) it may instruct the DTOPO circuit 230 to invert logical levels of the bits of the provided test pattern. In this manner, the number of available test patterns may be doubled without requiring more entries in the DTOPO circuits 230. Data mask bits (e.g., dm) are also provided, which may be used to mask the output of one of the data busses. The data mask bits may be used as part of a compare operation.

The DA converter circuit 226 may store a record of what information was written to which memory cells. For example, the DA converter circuit 226 may include a lookup table which may store row and column address information (C and R) along with the data pointer information (Dptr) and in some embodiments the inverse bit Dinv and mask bits dm. This stored information may be retrieved when a read command is issued to the same memory cells (e.g., based on the address information) and used to provide the original test pattern for comparison to the read test pattern.

When the test data is read from the memory cells, row and column address information may also be provided. When the read command along with the row and column address is provided to the DA converter circuit 226, the DA converter circuit may retrieve the data information from the look up table. This data information may be provided to the DTOPO circuit 230, which in turn may provide the test pattern associated with that data information to the ECM circuit 232. This test pattern may be the test pattern which was written to the memory cells associated with the address information as part of an earlier write operation. In the meantime, the read command and the address information may be provided to the core die 206, which may provide the read test data from the memory cells associated with that address information to the ECM circuit 232. The ECM circuit 232 may compare the test data from the DTOPO 230 to the read test pattern and may generate result information based on that comparison. The ECM circuit 232 may store a number of such pieces of result information until they are subsequently retrieved from the ECM circuit 232.

Block 424 may generally be followed by block 432 which describes placing the memory device 200 into the DA1500 mode. The memory device 200 may be transitioned from the DA hybrid mode 326 to the DA1500 mode 322.

Block 432 may generally be followed by block 434, which describes reading an ECM result. As previously discussed, the ECM circuit 232 may be used to store multiple entries of result information, where each entry represents a summary of a comparison between a written test pattern and a read test pattern. Table 3 represents an example of an entry which may be read out from the ECM circuit 232.

TABLE 3

Example Entry of an ECM Circuit

| Bits | Description |
| --- | --- |
| Register group X | SID |
| Register group W | Bank |
| Register group V | Row Address |
| Register group U | Column Address |
| Register group T | Data Inv |
| Register group S | DTOPO Pointer |
| Register group R | Byte/DQ/UI Fail Information |
| Register group Q | Fail Flag |

Similar to Table 1, the first column identifies one or more bits of a string of bits stored in an entry of the ECM circuit 232. In some example embodiments, each entry may be longer (e.g., more bits) than each DTOPO entry. The second column identifies what meaning is associated with the bit(s) identified in the first column, and the third column provides additional notes.

An entry of the ECM circuit 232 may include fail information. For example, Register group Q is a fail flag, which may be used to indicate if the process of carrying out the test was carried out successfully or not. If the fail flag is at a low level, it may indicate that the test failed in some manner, and that the remainder of the data in the entry is invalid. An entry of the ECM circuit 232 may include information about the memory cells which were tested and the test which were performed on them. For example, Register groups U, V, and W include address information, such as bank information, row address information, and column address information. Register group X may include system identification (SID) information. An entry of the ECM circuit 232 may include information about the test pattern which was used. For example, register groups S and T include pointer information (e.g., the value of Dptr) and data inverse information (e.g., Dinv).

An entry of the ECM circuit 232 may also include a number of 'failure' bits which represent the result of the test. There may be a failure bit for each bit which was written as part of a test pattern (and therefore also read as part of a read test pattern). Each failure bit may represent the result of comparing a bit of the written test pattern to the corresponding bit of the read test pattern. In some embodiments, the failure bits may be the result of a logical operation such as an XOR between the written test bit and the corresponding read test bit. Accordingly, the failure bit may be at a logical low if the written and read test bit match, and at a high logical level if the bits do not match. Other methods of comparing the written and read test bits may be used in other example embodiments.

The embodiment of Table 3 may include result information for a test performed using the test pattern described in Table 1. Accordingly, there may be four sets of four bytes each, with a set of four bytes written together during a unit interval. Accordingly register group R includes failure information for each of four bytes over each of four different unit intervals (e.g., 16 total bytes of failure information). In some embodiments, register group R may also include error correction information.

Similar to how they may be multiple DTOPO circuits 230, there may also be multiple ECM circuits 232. For example, there may be a separate ECM circuit 232 for each channel of the memory and for each data word along that channel. For example, if there are eight channels and four data words per channel, there may be 32 total ECM circuits 232. Each ECM circuit 232 may also include a number of entries (e.g., similar to the example entry shown in Table 3) each which are associated with comparing a written data word's worth of test data and read data word's worth test data. In some embodiments, each ECM 232 may have a different number of entries than each DTOPO 230. In some embodiments, each ECM 232 may have the same number of entries as each DTOPO 230.

In some embodiments, the method 400 may be performed such that all desired test patterns are written to and read from the memory (e.g., as part of step 424) before the results of those tests are read out from the ECM circuits 232. In some embodiments, it may generally be faster to perform the testing than to read the result of that test. For example less data may be provided along the DA uBumps 216 to perform the test (e.g., the 28 bits of the example of Table 2) than to retrieve the result of that test (e.g., the 184 bits of the example of Table 3). Accordingly, to efficiently utilize time, a number of tests may be rapidly performed, and then the results may be subsequently read out. In some embodiments, a number of tests may be run based on the number of total entries of the ECM circuits 232. For example, during the step described in block 424, a number of tests may be performed until the total number of entries across the ECM circuits 232 are full. The method 400 may then progress to block 434, where the ECM circuits 232 are emptied by reading out those entries. In some embodiments, if it is desired to perform more tests than the ECM circuits 232 have room to store the results of, then after the step of block 434 is performed, the method may return to the step of block 422, and the testing may repeat.

Figure 5:
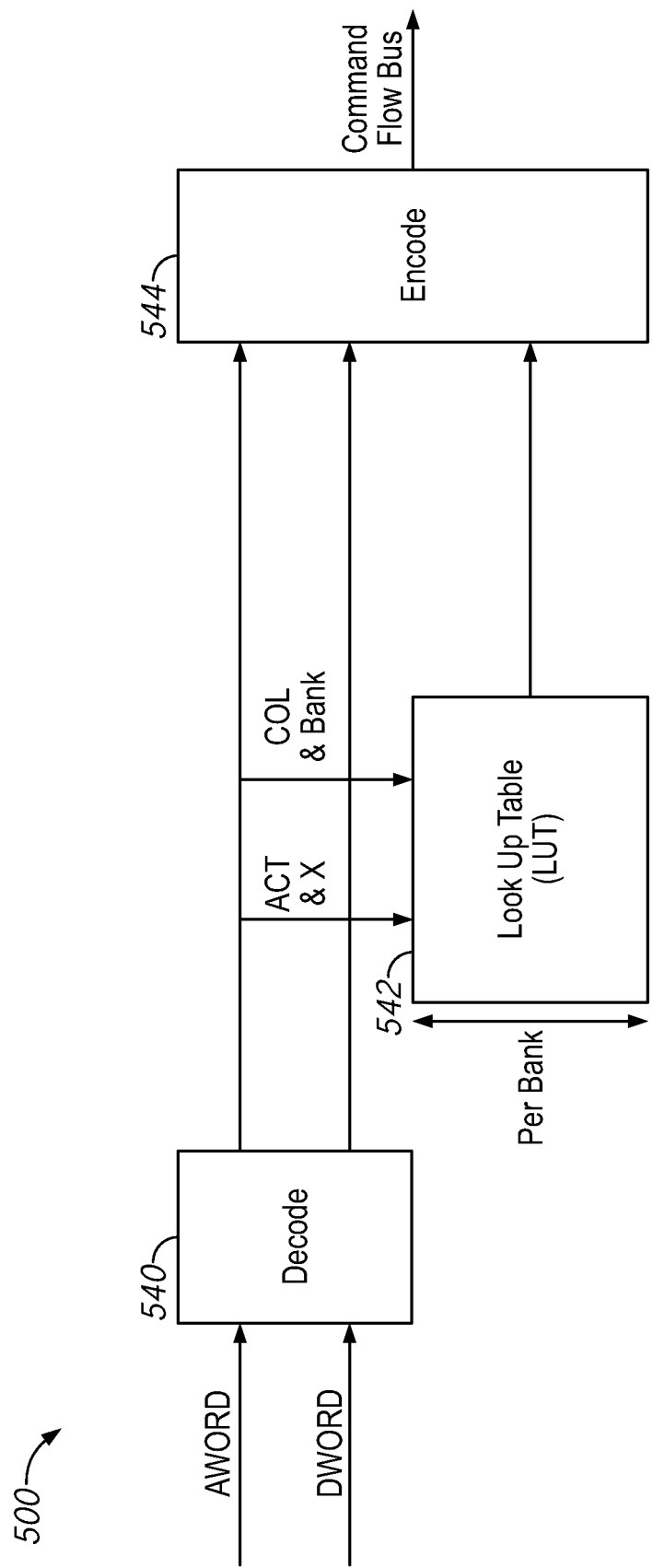
FIG. 5 is a direct access converter circuit according to an embodiment of the present disclosure.

FIG. 5 is a direct access converter circuit according to an embodiment of the present disclosure. The DA converter circuit 500 may, in some embodiments, be included in the DA converter circuit 226 of FIG. 2. The DA converter circuit 500 may receive signals from DA uBumps (e.g., 216 of FIG. 2) when a memory device is in a DA hybrid mode (e.g., 422 of FIG. 4). The DA converter circuit may receive information which include command and address information as an AWORD and information which includes data information as a DWORD. Because there may be a delay between when a command is received to write a test pattern to some specified memory cells, and when the data is read back out from those memory cells, the DA converter circuit 500 may store a record of what test data was written to which memory cells, so that later comparisons may be performed.

The DA converter circuit 500 includes a decoder circuit 540 which receives an AWORD and a DWORD provided via a deserializer circuit (e.g., 222 of FIG. 2) from DA uBumps (e.g., 216 of FIG. 2). The decoder circuit 540 may be used to interpret the information in the AWORD and the DWORD. For example, the AWORD may receive the inputs from various DA uBumps, and may group the information together based on a mapping of which DA uBumps are used to convey which pieces of information (e.g., based on the pin mapping of Table 2). The decoded information may be provided to an encoder circuit 544, which may organize the decoded information into a fashion such that the information can be provided in a format that will be recognized by the core dies of the memory (e.g., core dies 206 of FIG. 2). For example, the encoder circuit 544 may encode the information received from the decoder circuit 540 as command flow bus information.

The DA converter circuit 500 also includes a look-up table 542, which may be used to store (all or a portion of) the information provided by the decoder circuit 540. For example, the look-up table 542 may store address information provided by the decoder circuit (e.g., row, column, and bank address information) along with information about the test pattern (e.g., the data pointer, data mask, and data inverse bit). In some embodiments, one or more pieces of address information may be used as index information of the look up table 342. For example, in some embodiments the bank information may be used to index the look up table 342. In one example embodiment, there may be one entry in the look up table 342 for each value of the bank address. Accordingly, if there are 32 banks, there may be 32 entries in the look up table 342.

When test operations are being performed (e.g., during the step 424 of FIG. 4), test patterns may be written to memory cells and then read from those memory cells, and the written and read test data may be compared. However, a write operation to a certain set of memory cells (e.g., to a given row/column/bank address) does not necessarily have to be immediately followed by a read command from that set of memory cells. In other words, after a test pattern is written to a first set of memory cells, data may be written to or read from one or more other sets of memory cells before the test pattern is read out from the first set of memory cells. When a read command is issued, the look up table 542 may provide information about which test pattern was previously written to those memory cells based on the address information. For example, the look up table may provide the data pointer, data mask, and data inverse information out through the encoder circuit 544 to the DTOPO circuit. The DTOPO circuit in turn may provide the test pattern to the ECM circuit for comparison.

Figure 6:
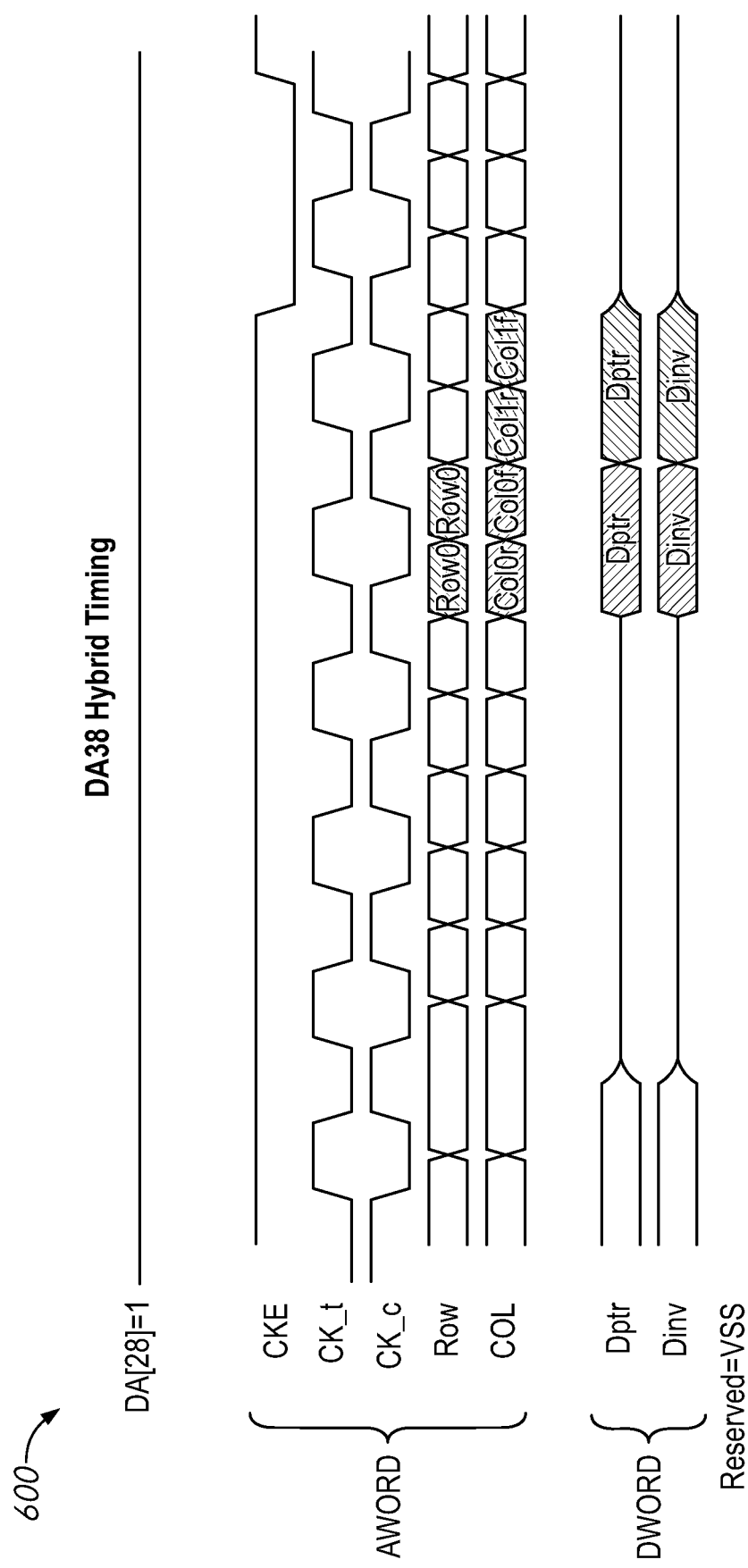
FIG. 6 is a timing diagram of signals in a direct access hybrid mode test operation according to an embodiment of the present disclosure.

FIG. 6 is a timing diagram of signals in a direct access hybrid mode test operation according to an embodiment of the present disclosure. The timing diagram 600 represents the operation of various signals provided to DA uBumps (e.g., 216 of FIG. 2) during testing operations using a DA hybrid mode (e.g., block 424 of FIG. 4).

The first signal line represents the DA enable signal, which may be active throughout DA hybrid mode operations. The next set of signals represent command and address signals, such as an AWORD. The first signal is a clock enable signal CKE used to determine if the memory device is receiving a clock signal or not. The next two signals CK_t and CK_c are the clock signals. The remaining two signals of the AWORD are the row address and column address. The row address may be a seven bit signal, and the column address may be a nine bit signal. The next two signal lines represent signals which may be included in data information, such as a DWORD. In particular, a data pointer signal Dptr and a data inverse signal Dinv are shown. The final signal line of the timing diagram 600 represents a reserved signal line which is used to transmit a ground voltage (e.g., VSS) to the memory device.

In particular, the embodiment shown in the timing diagram 600 may be an embodiment where both rising and falling clock edges are used to clock information being provided to the memory device along the DA uBumps. In an example, the clock signal has a frequency of 1.6 GHz, then the row and column address information may be transmitted at a rate of 3.2 Gbps (e.g., twice the frequency of the clock signal). Note that the DWORD signal may still be clocked to either the rising or falling edge of the clock signal and so may have a data rate of 1.6 GBps. Accordingly, since row and column address information may be provided to the memory twice as fast, more pin assignments may be required than were used in the example of Table 2. Table 4 shows an example set of pin assignments which may be used by the example embodiment of FIG. 6 in addition to the pin assignments of Table 2.

TABLE 4

Example Falling Edge Address Pin Assignments AWORD

| DA Pin | I/O | Functionality |
|---|---|---|
| DA[s + 8:s] | I | Cf[8:0] |
| DA[t + 6:t] | I | Rf[6:0] |

The example of Table 4 shows how 16 extra pins (7 for the row address and 9 for the column address) may be used to provide a row and column address which may be read on the falling edge of a clock signal. The pin assignments of Table 4 may be used together with the pin assignments previously described in the example of Table 2 to provide a row and column address on the rising edge of the clock signal and a row and column address on the falling edge of the clock signal. The data information (e.g., data pointer Dptr, data inverse Dinv, and data mask dm) may be shared by the two different sets of addresses.

Figure 7:
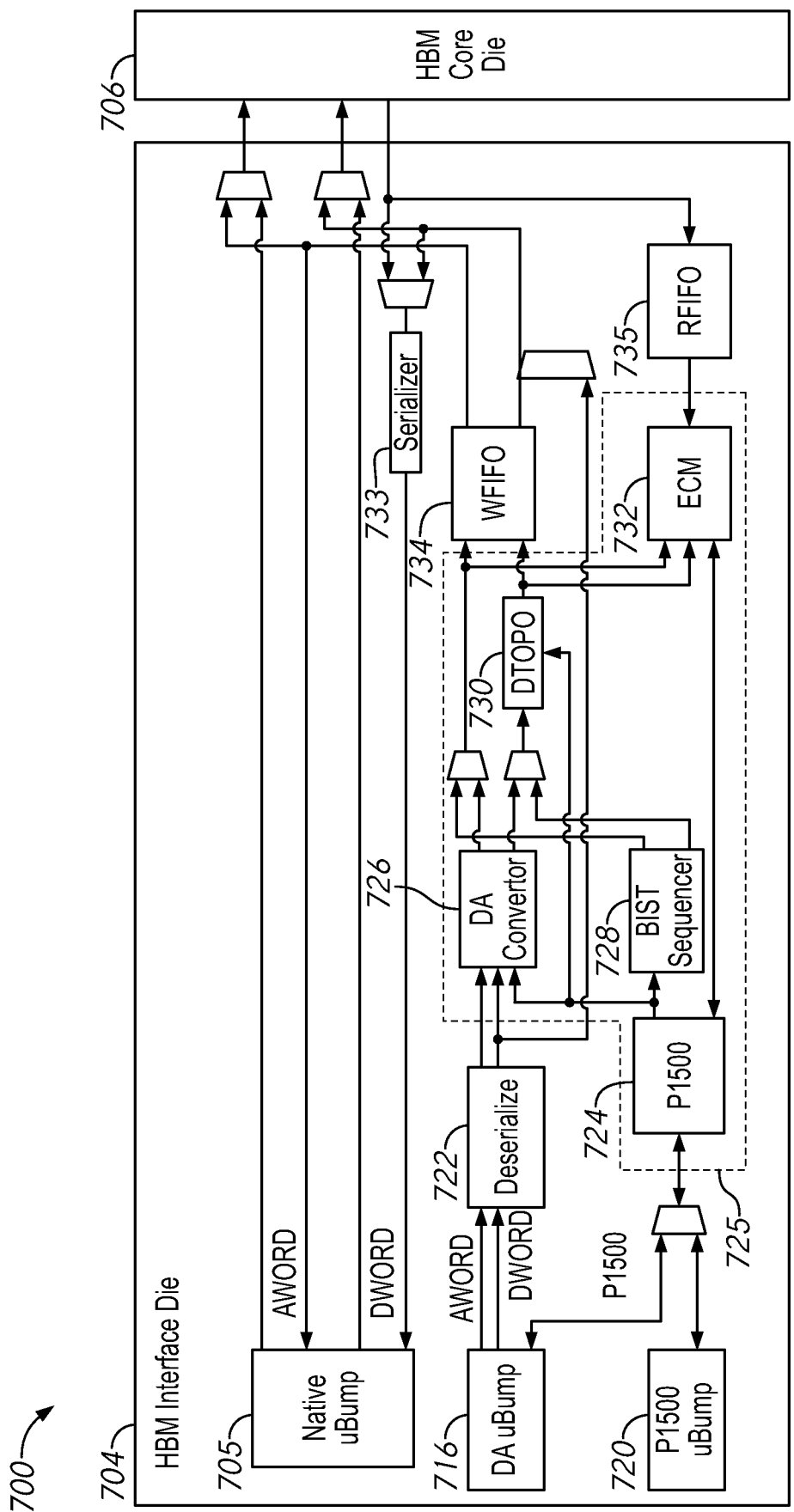
FIG. 7 is a block diagram of a memory device according to an embodiment of the present disclosure.

FIG. 7 is a block diagram of a memory device according to an embodiment of the present disclosure. The memory device 700 may generally be similar to the memory device 200 of FIG. 2, and for the sake of brevity, features and components which were previously described in regards to FIG. 2 will not be described again.

The memory device 700 represents an embodiment where the DA direct mode of the memory device 700 has been removed, and the only access modes through the DA uBumps 716 are the DA hybrid mode or the DA 1500 mode. Accordingly, the signal lines which allowed information from just after the deserializer 722 directly to the core die 706 have been removed. Instead, information provided from the deserializer 722 is provided to the DA converter circuit 726.

FIG. 8 is a block diagram of a memory device according to an embodiment of the present disclosure. The memory device 800 may generally be similar to the memory device 200 of FIG. 2, and for the sake of brevity, features and components which were previously described in regards to FIG. 2 will not be described again.

The memory device 800 represents an embodiment without a BIST circuit (e.g., BIST sequencer 228 has been omitted). Accordingly, the memory device 800 may not have a BIST mode, and may be transitioned from a P1500 mode directly to a DA1500 mode.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a direct access (DA) terminal;
    a memory array;
    a look up table configured to store a plurality of test patterns;
    a direct access hybrid (DA hybrid) circuit configured to receive a test instruction from the direct access terminal, and provide a selected one of the plurality of test patterns from the look up table based on the test instruction;
    an error catch memory (ECM) circuit configured to store result information based on the test instruction.

2. The apparatus of claim 1, wherein the apparatus includes a high bandwidth memory (HBM) device comprising:
    an interface die including the direct access terminal, the look up table, the DA hybrid circuit, and the ECM circuit; and
    a core die including the memory array.

3. The apparatus of claim 1, wherein the test instruction includes an address associated with selected memory cells of the memory array and a pointer value associated with the selected one of the plurality of test patterns in the look up table, and wherein responsive to the test instruction the selected test pattern is stored in the selected memory cells.

4. The apparatus of claim 3, wherein the DA hybrid circuit is configured to store the test instruction and provide the pointer value to the look up table when data is read from the selected memory cells associated with the test instruction.

5. The apparatus of claim 1, wherein the ECM circuit is configured to receive read data from memory cells of the memory array and the selected test pattern from the look up table and generate the result information based on a comparison of the read data and the selected test pattern.

6. The apparatus of claim 1, further comprising a test interface circuit configured to receive the plurality of test patterns from the DA terminal and store them in the look up table and provide the result information from the ECM circuit to the DA terminal.

7. The apparatus of claim 6, wherein the test interface circuit is a IEEE 1500 interface circuit.

8. An apparatus comprising:
a direct access (DA) terminal;
at least one core die including a plurality of memory cells; and
an interface die configured to store a plurality of test patterns in a look-up-table, wherein the interface die is configured to receive through the DA terminal an address associated with at least one of the plurality of memory cells and an index pointer associated with a selected one of the plurality of test patterns in the look-up-table and configured to store the selected one of the plurality of test patterns to the memory cells associated with the address.

9. The apparatus of claim 8, wherein the interface die is further configured to read the selected one of the plurality test patterns from the memory cells, compare the read test pattern to the selected one of the plurality of test patterns, and generate result information based on the comparison.

10. The apparatus of claim 9, wherein the interface die is configured to provide the result information to the DA terminal.

11. The apparatus of claim 10, wherein the plurality of test patterns are loaded into the look-up-table through the DA terminal in a first operational mode of the apparatus, and wherein the address and the index pointer are provided to the DA terminal as part of a second operational mode of the apparatus.

12. The apparatus of claim 11, further comprising a test interface circuit configured to receive the plurality of test patterns while the apparatus is in the first operational mode.

13. The apparatus of claim 8, wherein the DA terminal includes a probe pad.

14. A method comprising:
receiving a test instruction at a direct access terminal of a memory;
selecting a test pattern from a plurality of test patterns stored in a look up table of the memory based on the received test instruction;
writing the test pattern to memory cells of the memory;
reading data from the memory cells; and
comparing the test pattern to the read data and generating result information based on the comparison.

15. The method of claim 14, further comprising putting the memory in a direct access IEEE 1500 operational mode and reading the result information through the direct access terminal in the IEEE 1500 operational mode.

16. The method of claim 14, further comprising putting the memory in a direct access IEEE 1500 operational mode and storing the plurality of test patterns in the look up table.

17. The method of claim 14, further comprising storing the received test instructions and wherein comparing the test pattern to the read data includes retrieving the test pattern based on the stored test instruction.

18. The method of claim 14, wherein the test instruction includes a data pointer associated with the selected test pattern and an address associated with the memory cells.

19. The method of claim 18, further comprising receiving a first address at a rising edge of a clock signal and receiving a second address at a falling edge of the clock signal.

20. An apparatus comprising:
a memory device including a direct access terminal; and
a tester configured to
put the memory device in a first operational mode and provide a plurality of test patterns to the direct access terminal,
put the memory device in a second operational mode and provide at least one test instruction to the direct access terminal, and
put the memory device in the first operational mode and receive results information associated with the at least one test instruction, wherein the first operational mode is a direct access IEEE 1500 mode.

21. The apparatus of claim 20, wherein the at least one test instruction includes an address and a data pointer associated with one of the plurality of test patterns.

22. The apparatus of claim 21, wherein the data pointer includes a first number of bits and wherein each of the plurality of test patterns includes a second number of bits greater than the first number of bits.

* * * * *